United States Patent [19]
Cho et al.

[11] Patent Number: 5,226,053
[45] Date of Patent: Jul. 6, 1993

[54] LIGHT EMITTING DIODE

[75] Inventors: Alfred Y. Cho, Summit; Erdmann F. Schubert, New Providence; Li-Wei Tu, Westfield; George J. Zydzik, Columbia, all of N.J.

[73] Assignee: AT&T Bell Laboratories, Murray Hill, N.J.

[21] Appl. No.: 815,307

[22] Filed: Dec. 27, 1991

[51] Int. Cl.$^5$ .................................................. H01S 3/19
[52] U.S. Cl. .................................. 372/45; 372/96; 372/99; 372/49
[58] Field of Search ................. 372/43, 45, 96, 99, 372/49; 357/17, 16, 4; 257/13, 14, 15

[56] References Cited

U.S. PATENT DOCUMENTS

| | | | |
|---|---|---|---|
| 4,943,970 | 7/1990 | Bradley | 372/45 |
| 4,949,351 | 8/1990 | Imanaka | 372/45 |
| 5,018,157 | 5/1991 | Deppe et al. | 372/45 |
| 5,048,035 | 9/1991 | Sugawara et al. | 372/45 |
| 5,068,868 | 11/1991 | Deppe et al. | 372/45 |
| 5,115,441 | 5/1992 | Kopf et al. | 372/45 |

FOREIGN PATENT DOCUMENTS

| | | | |
|---|---|---|---|
| 0081887 | 5/1985 | Japan | 372/45 |
| 0081888 | 5/1985 | Japan | 372/45 |
| 0086883 | 4/1987 | Japan | 372/45 |
| 0264285 | 10/1989 | Japan | 372/45 |
| 0266779 | 10/1989 | Japan | 372/45 |

OTHER PUBLICATIONS

A. Zehe et al. "Annealing Dependent Far Field of GaAs-(Ga,Al) As LEDs", *Czech. J. Phys.*, B 23 (1973), pp. 567-575.

S. M. Sze, *Semiconductor Devices Physics and Technology*, John Wiley & Sons, New York, 1985, pp. 258-267.

N. K. Dutta, "III-V Device Technologies For Lightwave Applications", *AT&T Technical Journal*, vol. 68, No. 1, Jan./Feb. 1989, pp. 5-18.

H. Yokoyama et al., "Enhanced Spontaneous Emission from GaAs Quantum Wells in Monolithic Microcavities", *Appl. Phys. Lett.* 57 (26), 24 Dec. 1990, pp. 2814-2816.

T. J. Rogers, et al. "Effect of an AlAs/GaAs Mirror on the Spontaneous Emission of an InGaAs-GaAs Quantum Well", *Appl. Phys. Lett.*, 57 (18), 29 Oct. 1990, pp. 1858-1860.

T. Kato, et al. "GaAs/GaAlAs Surface Emitting IR LED With Bragg Reflector Grown by MOCVD", *Jrnl of Crystal Growth* 107 (1991) pp. 832-835.

*Primary Examiner*—Georgia Y. Epps
*Attorney, Agent, or Firm*—Oleg E. Alber

[57] ABSTRACT

This invention embodies a LED in which an optical cavity of the LED, which includes an active layer (or region) and confining layers, is within a resonant Fabry-Perot cavity. The LED with the resonant cavity, hereinafter called Resonant Cavity LED or RCLED, has a higher spectral purity and higher light emission intensity relative to conventional LEDs. The Fabry-Perot cavity is formed by a highly reflective multilayer distributed Bragg reflector (DBR) mirror ($R_B \geq 0.99$) and a mirror with a low to moderate reflectivity ($R_T \approx 0.25$–$0.99$). The DBR mirror, placed in the RCLED structure between the substrate and the confining bottom layer, is used as a bottom mirror. Presence of the less reflective top mirror above the active region leads to an unexpected improvement in directional light emission characteristics. The use of a Fabry-Perot resonant cavity formed by these two mirrors results in optical spontaneous light emission from the active region, which is restricted to the modes of the cavity. While the bottom DBR mirror reduces absorption by the substrate of that light portion which is emitted toward the substrate, the two mirrors of the resonant cavity reduce the isotropic emission and improve the light emission characteristics in terms of a more directed (anisotropic) emission.

22 Claims, 8 Drawing Sheets

LIGHT EMITTING DIODE

TECHNICAL FIELD

This disclosure pertains to light emitting diodes.

BACKGROUND OF THE INVENTION

Light emitting diodes (LEDs) which emit light spontaneously under forward bias conditions have a variety of applications such as indicator lights, elements of visual displays, light sources for optical data links, optical fiber communication, and others. Of special interest for use in optical fiber communications are devices in which the light is emitted from the top surface of the device.

Prior art LEDs, used for optical fiber communication, typically emit light through an aperture in a top electrode which is upon a substrate layer of the device. A typical prior art LED includes in a descending sequence a top electrode, a substrate, a top confining layer, an active layer, a bottom confining layer, a bottom contact layer, a centrally located bottom electrode of relatively small area, a dielectric layer upon the remainder of the bottom contact layer, and a heat-sink. The top electrode has a centrally located aperture through which the spontaneous light emission takes place. The light emission, from the LED may be picked-up by an optical fiber, an end of which may abut the surface of the substrate within the electrode aperture. To catch greater proportion of the emitted light, the LED may be provided with a vertical well which is etched coaxially in the substrate down to the surface of the confining layer; this enables one to bring an end of the optical fiber closer to the source of the emission. In another version, a lens may be integrally formed in the surface of the substrate to capture and focus into the core of the optical fiber the light being emitted through the circular opening in the top electrode. For example see S. M. Sze, *Semiconductor Devices, Physics and Technology*, John Wiley & Sons, New York, 1985, pp. 258-267, and an article by Niloy K. Dutta, "III-V Device Technologies For Lightwave Applications", *AT&T Technical Journal*, Vol. 68 No. 1, January-February 1989, pages 5-18.

Unfortunately, the present-day LEDs suffer from numerous deficiencies. Light emission in the LED is spontaneous, and, thus, is limited in time on the order of 1 to 10 nanoseconds. Therefore, the modulation speed of the LED is also limited by the spontaneous lifetime of the LED. This limits the maximum modulation frequency to $f_{max} = 200-400$ Mbit/s. Next, light emission in the active region is isotropic, that is in all directions, such that only a fraction of the emission may leave the body through the opening in the top electrode. Spectral linewidth of the LED is broad, of the order of 1.8 kT where kT is the thermal energy. This results in chromatic dispersion in optical multimode fibers, i.e., pulse broadening, which limits the maximum distance of transmission of light emitted by an LED to a few kilometers at high transmission rates.

Attempts were made to improve the performance of the LEDs. For example an LED disclosed in U.S. Pat. No. 5,048,035 issued Sep. 10, 1991 to Hideto Sugawara et al. represents an attempt to increase emission of light from the top surface of the LED by providing a special current blocking semiconductor layer between a centrally located top electrode and the luminescent cavity so as to have a higher light extraction efficiency and luminescence. The current from the top electrode is widely spread by current blocking layer over the light emitting region leading to higher light extraction and higher luminance than with conventional LEDs. This LED includes in an ascending order a bottom electrode, a substrate, a bottom layer, an active layer, a top confining layer, a current blocking layer, a dot-like top contact layer, and a dot-like top electrode overlaying the contact layer. Except for the top electrode area, the light emission takes place from the upper semiconductor surface and not through the substrate. However, while such an emission is suitable for display and LED lamps, this emission is not suitable for optical fiber communication requiring a narrow line width of spontaneous emission.

Another attempt to improve luminescence output of an LED is described in an article by T. Kato et al., "GaAs/GaAlAs surface emitting IR LED with Bragg reflector grown by MOCVD", *Journal of Crystal Growth*, Vol. 107 (1991) pages 832-835, North Holland. The structure of this LED resembles generally the structure of the Sugawara et al. device. Namely, in the structure, the substrate is at the bottom of the device, and a top electrode is in the center of the top surface of the device. However, in this device the current blocking layer is absent, the contacting layer overlies all of the surface of the top confining layer, and the top surface of the contacting layer is coated with an antireflection layer to prevent reflections from the top surface-air interface. This LED also includes a multilayer distributed Bragg reflector (DBR) positioned between the substrate and the bottom confining layer of the device. The purpose of the DBR is to reduce absorption of light emission by the substrate. In this device, as in the Sugawara et al. device, the emission takes place from the periphery of the LED and, except for the area covered by the top electrode, primarily from the top surface. While such an emission is suitable for display and LED lamps, this emission is also not suitable for optical fiber communication.

Therefore, it is desirable to design an LED with improved light emitting characteristics suitable for optical fiber communications.

SUMMARY OF THE INVENTION

This invention embodies a LED with improved light emitting characteristics. The optical cavity of the LED is near the top electrode and the light emission takes place through a central portion of the top surface of the LED which is opposite to the substrate side of the device. The optical cavity of the LED, which includes an active layer (or region) and confining layers, is within a resonant Fabry-Perot cavity. The LED with the resonant cavity, hereinafter called Resonant Cavity LED or RCLED, has a higher spectral purity and higher light emission intensity relative to conventional LEDs. The Fabry-Perot cavity is formed by a highly reflective multilayer distributed Bragg reflector (DBR) mirror ($R_B \geq 0.99$) and a mirror with a low to moderate reflectivity ($R_T \approx 0.25-0.99$). The DBR mirror, placed in the RCLED structure between the substrate and the confining bottom layer, is used as a bottom mirror. Presence of the less reflective mirror (top) above the active region leads to an unexpected improvement in directional light emission characteristics. The use of a Fabry-Perot resonant cavity formed by these two mirrors results in optical spontaneous light emission from the active region, which is restricted to the modes of the cavity. While the bottom DBR mirror reduces absorption by the substrate of that light portion which is emitted toward the substrate, the two mirrors of the resonant cavity reduce the isotropic emission and improve the light emission characteristics in terms of a more directed (anisotropic) emission.

DETAILED DESCRIPTION

This invention embodies a new concept of an LED, hereinafter referred to as a Resonant Cavity LED or simply RCLED. In this RCLED a spontaneously electroluminescent optical cavity of the LED is placed within a resonant Fabry-Perot cavity. The optical cavity includes at least one confining layer, but typically includes a top and a bottom confining layers and an active layer or region sandwiched between the two. The optical cavity is placed between two mirrors of the Fabry-Perot cavity such that the optical cavity is within a resonant Fabry-Perot cavity defined by a low absorbent and highly reflective distributed Bragg reflector (DBR) bottom mirror ($R_B \geq 0.99$) and a top mirror of low to moderate reflectivity ($R_T \approx 0.25 - 0.99$, preferably 0.50 to 0.99). The bottom DBR mirror is placed between the substrate and the optical cavity, while the top mirror is above the top confining layer. The length (L) of the optical cavity is relatively small. The optical cavity length (L) is a low integer multiple of $\lambda/2$, so that $L = N\lambda/2$ wherein N is a low integer, from 1 to 5, and $\lambda$ is the wavelength of the spontaneous emission of the active layer. The optical properties of this RCLED are superior to the conventional type LEDs. This structure also permits production of the RCLEDs by planar technology so that the fabrication process complexity is only moderately increased relative to conventional LEDs. The structure of the improved RCLED may be based on III-V or II-VI compound semiconductors, with III-V semiconductors including GaAs, AlAs, AlGaAs, GaInAs, InP, AlInP, GaInPAs, AlGaInAs, AlGaInPAs and their alloys.

The placement of the active electroluminescent region within the Fabry-Perot resonant cavity results in several clear advantages of the RCLED over conventional LEDSs some of which are outlined hereinbelow.

Firstly, enhanced spontaneous emission in RCLEDs results from the placement of the optical cavity into the resonant Fabry-Perot cavity. The probability for spontaneous emission is proportional to the optical matrix element of the initial and final electron state and proportional to the optical mode density. The carrier lifetime change is due to the strongly varying optical mode density in a Fabry-Perot cavity. The optical mode density in a Fabry-Perot resonator is strongly enhanced for on-resonance wavelengths. While off-resonance optical transitions have a longer lifetime, on-resonance transitions have a shorter lifetime. Spontaneous emission of the RCLED is therefore "channeled" into the optical resonance modes of the cavity. As a consequence, on-resonance transitions of the RCLEDs are enhanced.

Secondly, emission of light through the top contact side of the RCLED device is enhanced due to the highly reflective mirror adjacent to the bottom confinement layer. Light emission in conventional LEDs is typically close to isotropic and typically takes place through the substrate. In the RCLED structure, however, emission through the substrate is blocked by a bottom DBR mirror which has a much higher reflectivity than the top reflector mirror, i.e. $R_B >> R_T$. As a consequence, light propagating along the optical axis of the cavity exits the cavity predominantly through the top mirror. The anisotropic emission spectrum of the RCLED can enhance the emission through the top side by a factor of two.

Thirdly, the improved spectral purity of the RCLED makes the device well suited for optical fiber communication purposes. Conventional LEDs have spectral linewidths determined by the density of states in the conduction and valence band and the thermal energy of carriers or typical linewidths on the order of 1.8 kT, where kT is the thermal energy. A far better spectral purity can be achieved with the RCLED. The emission linewidth is a function of the finesse of the cavity. Thus, the linewidth is not a fixed parameter but can be designed by means of the cavity characteristics. In silica optical fibre applications the spectral purity is of prime importance and can be achieved by a high finesse cavity design. Since the spontaneous emission from the active region is constrained to emit into the modes of the optical cavity, the finesse of the cavity allows one to estimate the linewidth of the RCLED. The finesse of a coplanar Fabry-Perot cavity is given by:

$$F = \frac{\nu}{\Delta\nu} = 2\pi \frac{L_c}{\lambda} (-\ln\sqrt{R_B R_T})^{-1} \quad (1)$$

where $L_c$ is the optical cavity length, $\Delta\nu$ and $\nu$ are bandwidth and separation of the Fabry-Perot resonance modes and $R_B$ and $R_T$ are the reflectivities of the bottom and the top mirrors, respectively. In this equation absorption losses are neglected. For example, $L_c = \lambda$, $h\nu = 1.42$ eV, and $R_B R_T = 0.9$, yields a finesse of $F \approx 120$. The corresponding linewidth is $h\Delta\nu \approx 12$ meV which is much narrower than kT at room temperature. Due to the inherently high spectral purity of the RCLED, the device is expected to have less chromatic dispersion if used for optical transmission in silica fibres.

For illustration purposes, the present invention will be described with reference to devices based on $Al_x Ga_{1-x}As/GaAs$ material system with x ranging from 0 to 1. For the same purposes, elements of the various embodiments of the RCLED are not drawn to scale.

Figure 1:
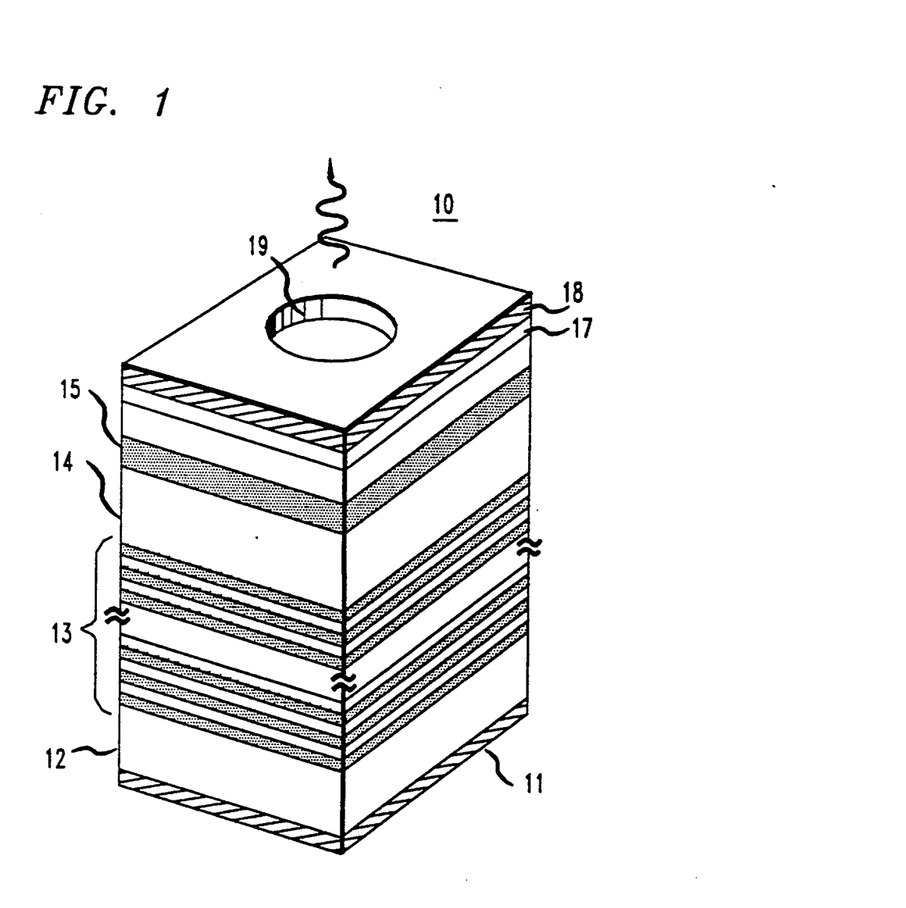
FIG. 1 is a schematic representation of an RCLED according to one exemplary embodiment, including a bottom DBR mirror adjacent the substrate and a semiconductor-air interface top mirror forming a Fabry-Perot resonant optical cavity with an optical cavity of the LED.

FIG. 1 is a general schematic representation of one exemplary embodiment of an RCLED according to this invention. RCLED of this embodiment, denominated generally as 10, comprises a bottom electrode 11, a substrate 12, a quarter-wave stack of a plurality of pairs of semiconductor layers forming a bottom DBR mirror, 13, one layer of each pair having a refractive index different from the refractive index of another layer of the pair; a bottom confining layer, 14; an active layer or region, 15; a top confining layer, 16; a highly-doped contact layer, 17, and a top electrode, 18, having a centrally located aperture 19. In this exemplary embodiment the top mirror of the Fabry-Perot cavity is formed by an interface between contact layer 17 and air within aperture 19. Such a mirror has a reflectivity of the order of 0.25 to 0.35. The light emission takes place through the aperture. While not shown, additional confining and buffer layers may be included into the structure.

Construction of RCLED 10, in accordance with the invention, may be described as being generally as follows:

Metal electrode 11 from 1 to 10 $\mu$m thick is formed on the bottom surface of substrate 11 to provide for current flow perpendicularly through the active region to cause spontaneous emission. Typically, bottom electrode 11 is formed after the device is assembled. The RCLED may be mounted with bottom electrode 11 in contact with a heat-sink plate, e.g. of copper or some other heat-conductive material which does not contaminate the materials of the device.

Substrate 12 is a heavily doped $n^+$-type (or p-type) III-V or II-VI semiconductor, such as GaAs or AlGaAs. Typically, the thickness of the substrate ranges from 100 to 500 $\mu$m and the doping concentration of the substrate ranges from $1\times10^{17}$ to $1\times10^{19}$ cm$^{-3}$. In some applications, such as optical-electronic integrated circuitry, substrate 12 may be first grown on a master substrate of silicon, which is in common to a number of devices grown on the master substrate.

Quarterwave stack 13 is composed of a plurality of pairs (or periods) of semiconductor layers forming a multilayer bottom DBR mirror with a number of pairs typically ranging from 10 to 40. One semiconductor layer in each pair has a higher index of refraction than the other semiconductor layer of the pair. The thickness of each semiconductor in the pair equals $\lambda/4n$, wherein $\lambda$ is the optical spontaneous emission wavelength of the active region of the LED and n is the refractive index of the semiconductor material. For a device with an active region spontaneously emitting at $\lambda=0.87$ $\mu$m, such as GaAs, a quarterwave stack of pairs of such semiconductors as GaAs and AlAs with refractive indices of 3.64 and 2.97, respectively, will consist of 62 nm thick GaAs layer and 73 nm thick AlAs layer while a stack of AlAs and $Al_{0.05}Ga_{0.95}As$ will consist of pairs of layers 73 nm and 60 nm thick each, respectively. It is important that the materials of the bottom mirror are so selected that the total reflective index, R, of the mirror is high, such as $R_B \geq 0.99$, while absorbence of luminescent emission by the multilayer mirror structure is minimal.

Bottom confining layer 14 and top confining layer 16 are provided to confine active region 15 and to adjust the length (L) of the optical cavity formed by the active region and the confining layers. (These confining layers may also be referred to as cladding or phase-matching layers.) The optical cavity length (L) of the RCLED should be an integer multiple of $\lambda/2$ so that $L=N\lambda/2$, with N being a low integer, such as from 1 to 5, and $\lambda$ being an optical wavelength of the spontaneous emission of the active layer. Typically, the thickness of each confining layer ranges from 0 to 3 $\mu$m. To obtain constructive interference, the thickness of the confining layers should be a multiple of $\lambda/2$ or $\lambda/4$ (assuming a phase change of 0° and $\pi$). In the exemplary embodiment the confining regions are of $Al_xGa_{1-x}As$, with x ranging from 0.1 to 0.4.

Active region 15 is a region in which spontaneous light emission takes place under proper bias. In the exemplary embodiment, the active region is a thin lightly doped ($1\times10^{16}-5\times10^{17}$ cm$^{-3}$) layer of GaAs. The active region may be in a form of a single layer or a region confined laterally by confining semiconductor material or by insulating material. The latter may be formed by etching a peripheral region of the active layer so as to form an active region mesa and filling the peripheral region by regrowth. Alternatively, proton ions, such as $H^+$ or $O^+$ may be implanted into the peripheral region of the active layer. The single active layer may be replaced by a single or a multiple quantum well (QW) structure composed of a narrow gap semiconductor about 1 to 30 nm thick, confined by wide-gap semiconductor. Alternatively, the single layer forming the active region may be replaced by a superlattice structure which is a multiquantum well structure with very thin barriers. The active region (QW, MQW or bulk semiconductor) is preferably placed at the antinode position of the optical intensity within the cavity.

Highly doped contact layer 17 is provided in thickness of from 0.01 to 0.1 $\mu$m to facilitate establishing a non-alloyed ohmic contact between the top confining layer 16 and the top electrode 18. Typically, the doping concentration in the contact layer 16 ranges from $1\times10^{19}$ to $1\times10^{20}$ cm$^{-3}$.

Electrode 18 is a non-alloyed ohmic contact selected from various electrode metals and alloys used for this purpose in the art, including Au-Zn and Au-Be. Such contacts are deposited by evaporation at temperatures ranging from 100° to 500° C., preferably from 100° to 250° C. Higher temperatures could result in undesirable alloying of the metal into the semiconductor leading to a rough interface morphology. Aperture 19, from 20 $\mu$m to 150 $\mu$m in diameter, may be defined by a resist formed prior to the deposition of electrode 18 or by standard photolithographic techniques after electrode 18 is formed.

Semiconductor layers 12 through 17 are grown upon substrate 11 by such known methods as metal organic vapor phase epitaxy (MOVPE), metal organic chemical vapor deposition (MOCVD), molecular beam epitaxy (MBE) or hydride vapor phase epitaxy (VPE). Preferably, the RCLED structures are grown by Molecular Beam Epitaxy (MBE) technology in a Ribier 2300 MBE system on heavily doped substrates 11. After layers 12 through 17 are grown, the partially formed structure is transferred to a separate high vacuum chamber where a metal layer is deposited on the surface of contact layer 17 as a non-alloyed ohmic contact in a desired thickness forming the top electrode of the structure. Bottom electrode 11, e.g., of In, may then be formed on the bottom surface of substrate 12. Finally, the bottom side of the RCLED may be mounted via the bottom electrode or by means of an electrically and thermally conductive adhesive, such as epoxy or silver solder or indium solder on a slab of a metal, such as Cu, Au, Be, which serves as a heat sink in common to other devices.

In a specific example of the first exemplary embodiment, the RCLED is an $Al_xGa_{1-x}As/GaAs$ system structure comprising in an ascending sequence 1 to 2 $\mu m$ thick In electrode 11, about 500 $\mu m$ thick (001) oriented heavily doped ($2 \times 10^{18}$ cm$^{-3}$) n+-GaAs substrate 12, bottom mirror 13 consisting of a quarter-wave stack of 30 pairs of n+-type ($5 \times 10^{17} - 5 \times 10^{18}$ cm$^{-3}$) semiconductor layers forming the DBR mirror structure, each pair of the stack consisting of a 73 nm thick layer of n+-AlAs and 60 nm thick layer of $Al_{0.14}Ga_{0.86}As$. The reflectivity spectrum of the DBR structure (bottom mirror 13), as measured with a Perkin-Elmer Lambda 9 UV/VIS/NIR Spectrophotometer, showed a broad high reflectivity band centered at ~0.87 $\mu m$ with a reflectivity >99 percent. The bottom mirror is followed by bottom confinement layer 14 of n+-$Al_{0.20}Ga_{0.80}As$ ($5 \times 10^{17}$ cm$^{-3}$) about 140 nm thick, lightly doped ($5 \times 10^{16}$ cm$^{-3}$) active layer 15 of p--GaAs about 10 nm thick, and top confinement layer 16 of p+-$Al_{0.30}Ga_{0.70}As$ ($5 \times 10^{16}$ cm$^{-3}$) about 80 nm thick. A thin heavily Be doped ($5 \times 10^{19}$ cm$^{-3}$) contact layer 17 of p+-$Al_{0.14}Ga_{0.86}As$, about 0.0625 $\mu m$ thick, is deposited on the top confinement layer to facilitate ohmic contacting. Top electrode 18, selected from such metal alloys as Au-Zn and Au-Be, is then deposited in a separate high vacuum chamber in a thickness of from 50 nm to 300 nm. Thereafter, a 20 $\mu m$ in diameter aperture 19 is formed in electrode 18 by etching. Alternatively, aperture 19 may be defined by a resist prior to the deposition of the top electrode.

Figure 2:
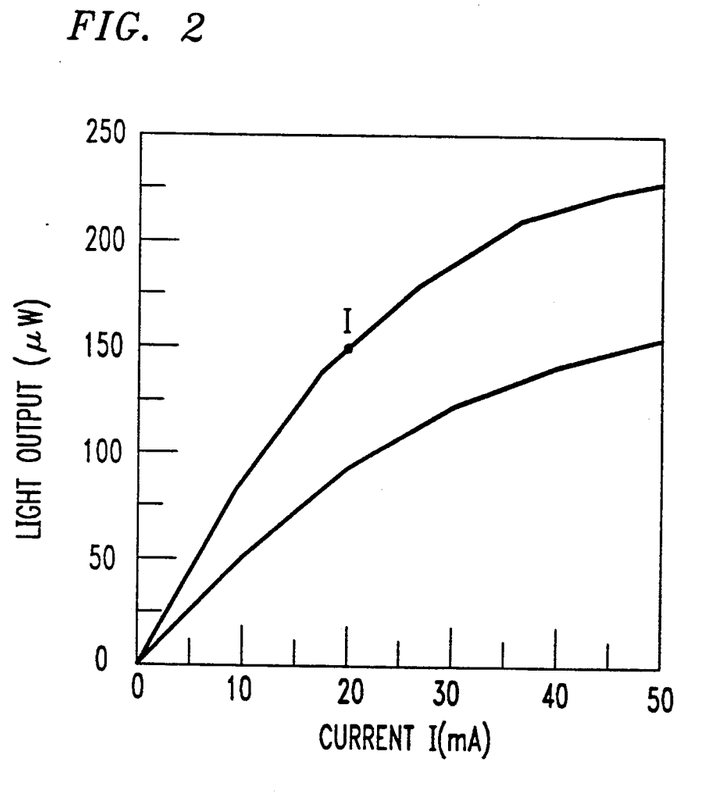
FIG. 2 is a plot of light emission intensity versus applied current, the upper curve being for an RCLED of FIG. 1 and the lower curve being for a conventional LED of similar general construction but without the DBR mirror.

Operation of the RCLED according to the first exemplary embodiment, leads to an increase in the quality of light intensity as compared to an LED of similar construction but without the DBR mirror. These differences are represented in FIG. 2 wherein the upper line represents the RCLED according to this invention and the lower line represents the conventional LED.

Figure 3:
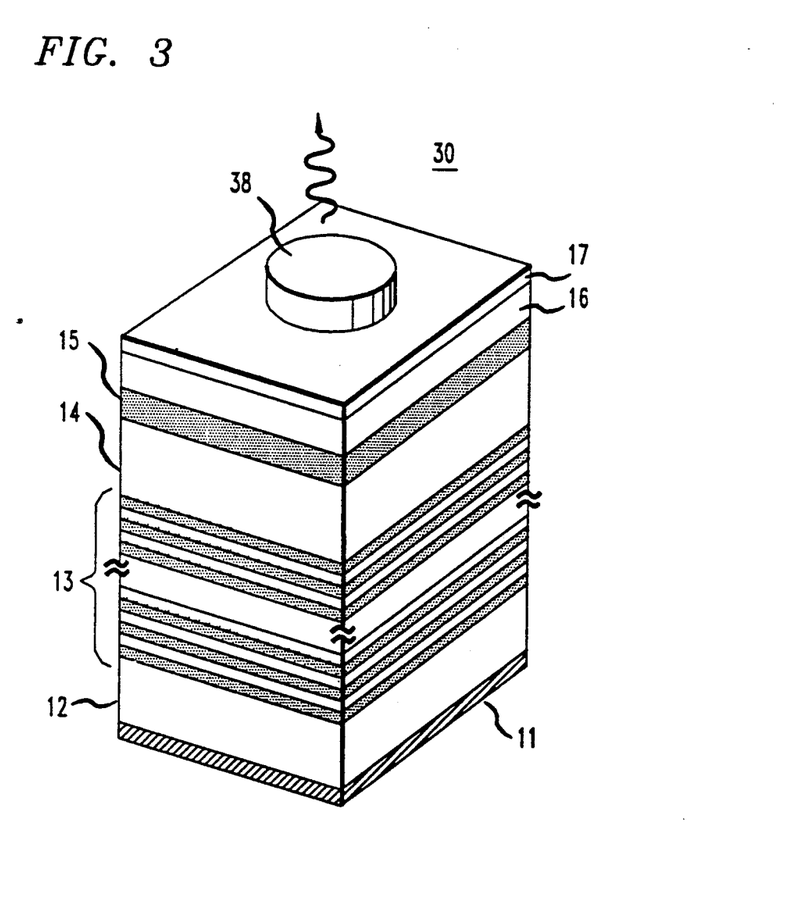
FIG. 3 is a schematic representation of an RCLED according to another exemplary embodiment, including a bottom DBR mirror and a top mirror with lower reflectivity which form a Fabry-Perot resonant optical cavity with an optical cavity of the LED.
Figure 7:
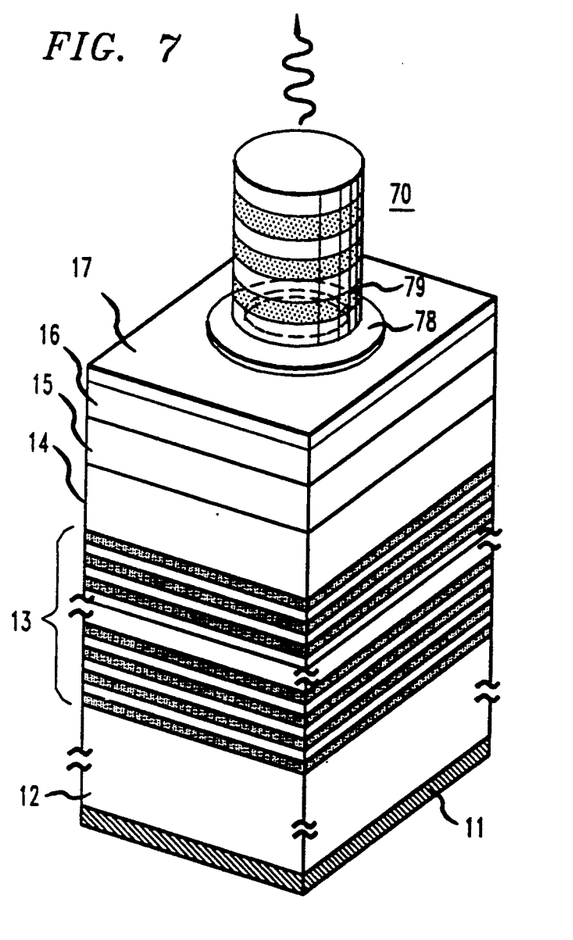
FIG. 7 is a schematic representation of an RCLED according to still another exemplary embodiment, depicting still another version of the top mirror.
Figure 8:
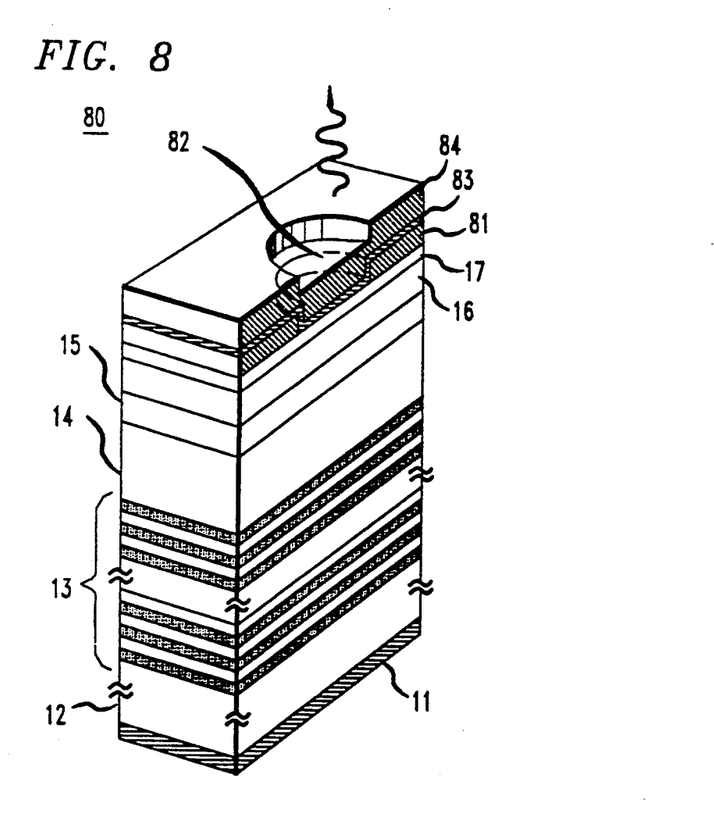
FIG. 8 is a schematic representation of an RCLED according to yet further exemplary embodiment, depicting a further version of the top mirror.

Additional exemplary embodiments of the RCLED structures were formed with different top mirrors. In each of these, most of the structure is similar to that of the first embodiment, except for the top mirror and top electrode. Wherever applicable, the same numerals are used in different exemplary embodiments to designate the same elements of the device as in the first exemplary embodiment. In each of the additional exemplary embodiments, the resonant cavity consists of bottom DBR mirror 13, bottom confinement layer 14, active region 15, top confinement layer 16, contact layer 17 and a top mirror-electrode. As a specific example of the materials the resonant cavity is formed by n-type $AlAs/Al_{0.14}Ga_{0.86}As$ bottom DBR mirror 13, n-type $Al_{0.30}Ga_{0.70}As$ bottom confinement layer 14, GaAs active region 15, p-type $Al_{0.30}Ga_{0.70}As$ top confinement layer 16, a heavily Be doped p+-type $Al_{0.14}Ga_{0.86}As$ contact layer 17 and a top mirror-electrode. The materials of the top mirror-electrode will be discussed with reference to each separate exemplary embodiment.

FIG. 3 is a schematic representation of a second exemplary embodiment of an RCLED, 30, according to the invention. In this Figure, a thin Ag, Al or Au dot electrode is being used as top electrode 38 which serves simultaneously as the electrode and as the top mirror of the RCLED.

Silver is chosen as the preferred metallic mirror/electrode because of its good conductivity and high reflectivity at wavelengths around 0.87 $\mu m$, which corresponds to the energy band gap of the active material GaAs. Additional current guiding (e.g. mesa-etch or proton implantation) is not required in the structure due to an occurrence of only small amount of current spreading. The Ag contact has excellent ohmic characteristics. The thin Ag film has reflectivities ranging from approximately 40 percent to 97 percent for thickness ranging from about 5 nm to 60 nm, as determined by an Anritsu MS9001B optical spectrum analyzer and an incandescent "white" tungsten light source, with higher reflectivities being for thicker layers and lower reflectivities being for thinner Ag layers. The reflectivity characteristics of these mirrors may be adjusted as needed by adjusting the thickness of the Ag layer.

Transmission Electron Microscopy (TEM) study of the RCLED structures grown in a Ribier 2300 MBE system disclosed the uniformity of the GaAs active region and the interface sharpness of the bottom mirror structure. X-ray $\theta/2\theta$ scans of Ag layers grown in a separate high vacuum chamber with various thickness up to 200 nm deposited at 120° C., showed that the Ag films are polycrystalline. Standard photolithographic techniques were employed to define circular Ag dots 38 with diameters ranging from 5 to 100 micrometers. An etchant of $3HNO_3:4H_2O$ was used to etch away unwanted Ag regions, which leaves a clean, smooth $Al_xGa_{1-x}As$ surface of contact layer 17.

These RCLEDs were electrically biased using a fine probe, and the electroluminescence specta were analyzed by a SPEX 1702/04 Spectrometer and a photomultiplier. Current-voltage characteristics were checked routinely with a Sony/Tektronix 370 Programmable Curce Tracer. The threshold voltage of the RCLED is close to the energy band gap of GaAs gain medium, which is 1.4 eV at room temperature. Above the threshold voltage, the current maintains a linear relation with the forward bias, indicating that the nonalloyed Ag contact is ohmic. All the measurements are done at room temperature, and no special cooling techniques are employed.

In a specific example, dot electrode 38 of silver (Ag) is formed on top of contact layer 17 in a thickness from about 15 to 50 nm, preferably 35 nm, under conditions leading to a non-alloyed ohmic contact. In this thickness range silver dot 38 is semi-transparent to light emission of the RCLED and has reflectivities ranging from 60 percent to 95 percent enabling its use simultaneously as a mirror and as a top electrode of the RCLED.

Figure 4:
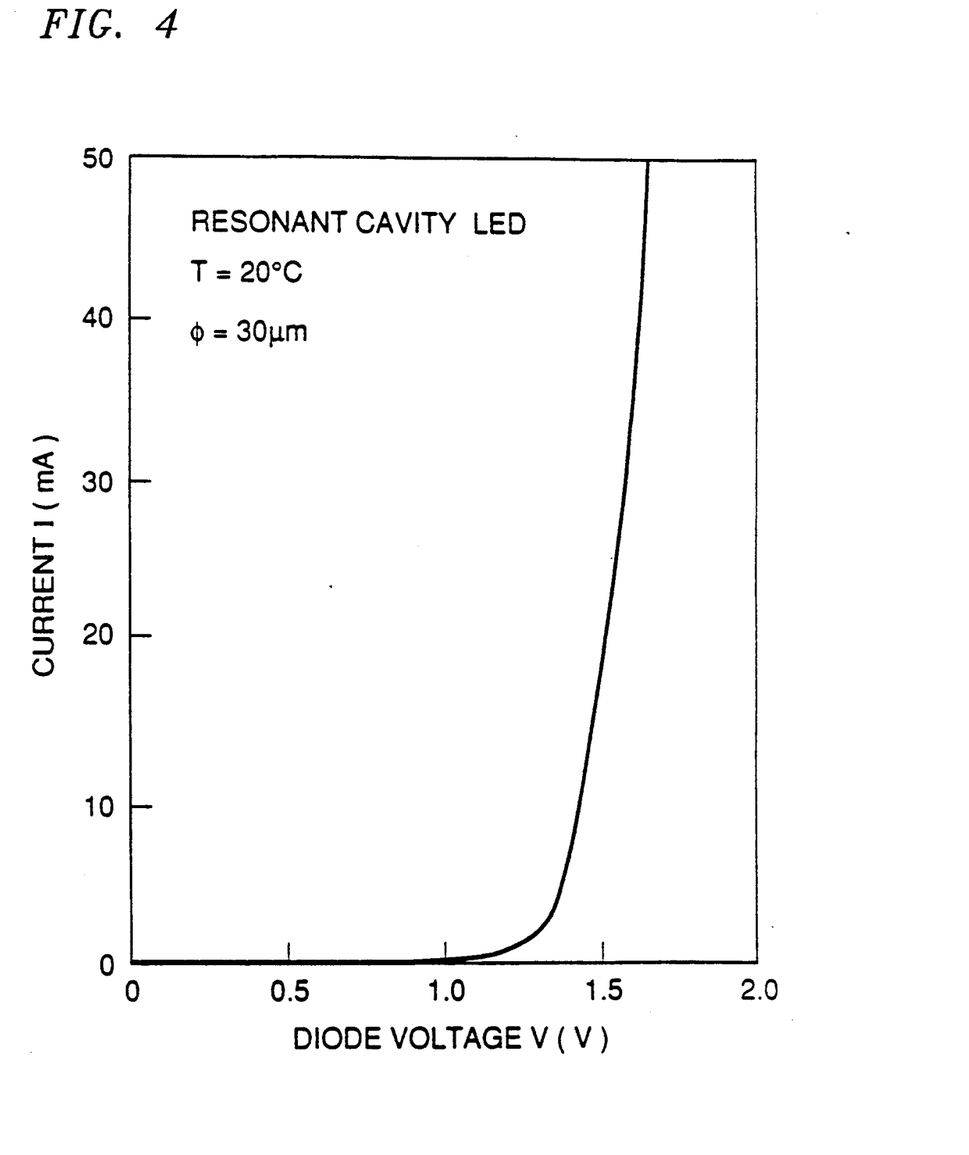
FIG. 4 is a plot of current-voltage characteristic of the RCLED represented in FIG. 3.

The current-voltage (I-V) characteristic of the RCLED structure is shown in FIG. 4 for a 30 $\mu m$ diameter 50 nm thick Ag contact. The I-V characteristic exhibits a "turn-on" voltage of 1.4 V and a high differential conductivity (dI/dV) indicating a low series resistance of the structure. The RCLED voltage does not exceed 2.0 V.

Figure 5:
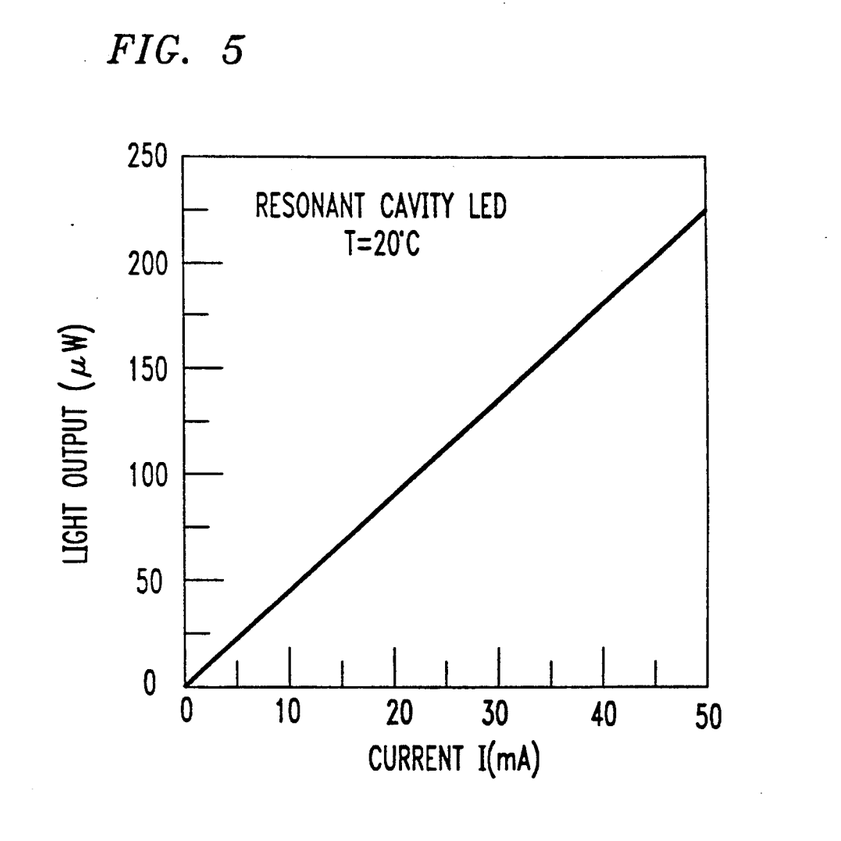
FIG. 5 is a plot of an optical output power versus injection current at room temperature of an RCLED represented in FIG. 3.

The optical power versus injection current characteristic of the RCLED with Ag mirror/electrode measured at room temperature is shown in FIG. 5. The light output power was measured with an ANDO AQ1125 optical power meter. The optical output power depends linearly on the injection current. The linear dependence is expected for the spontaneous emission regime and also indicates the absence of super-luminescence and stimulated emission. Non-linear emission spectra can also arise from saturable absorbers in the cavity. The absence of light vs. current nonlinearities, i.e. reabsorption processes, indicates the high quality of the epitaxial growth.

Figure 6:
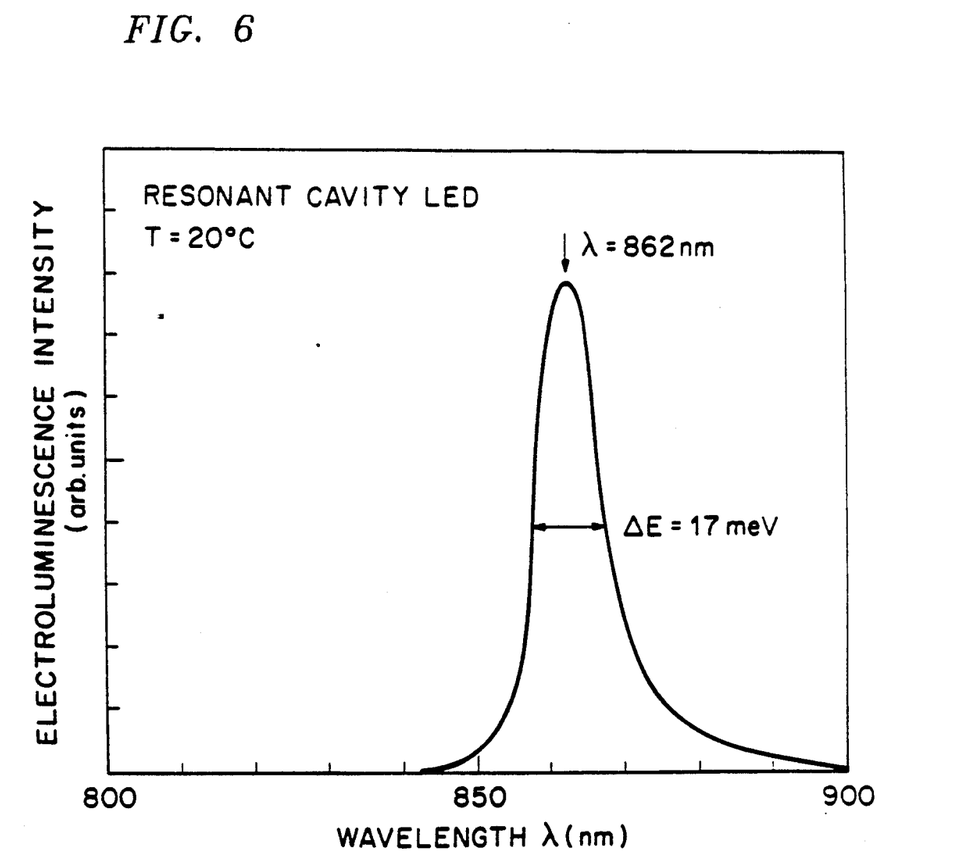
FIG. 6 is a plot of an electroluminescence spectrum at room temperature of the RCLED represented in FIG. 3; the spontaneous luminescence linewidth is narrower than thermal energy, kT, at room temperature.

The linewidths of the RCLED emission spectra are much narrower than the emission spectra of conventional LEDs. As stated above, the usual spontaneous linewidth of conventional LED is approximately 1.8 kT which corresponds to $\Delta\lambda \cong 28$ nm for $\lambda = 870$ nm at room temperature. The spontaneous electroluminescence emission spectrum of the RCLED is shown in FIG. 6. The emission peaks at $\lambda = 862$ nm and has a full-width at half-maximum of 17 meV ($\Delta\lambda = 10.5$ nm). The experimentally measured linewidths for this RCLED are much narrower than linewidths expected for spontaneously emitting conventional LEDs which have typical linewidths of 1.8 kT = 45 meV at room temperature. Even broader linewidths (e.g. 50-90 meV) may be expected for conventional GaInPAs LEDs spontaneously emitting at 1.3 $\mu$m.

FIG. 7 is a schematic representation of a third exemplary embodiment of an RCLED, 70, according to this invention. In this Figure elements 11 through 17 are the same as in the first and second exemplary embodiments. An annular metal electrode 78, preferably of Ag, overlies a central portion of contact layer 17 forming a non-alloyed ohmic contact with contact layer 17. Electrode 78 ranges from 50 nm to 300 nm in thickness and has an outer diameter within a range of from 10 $\mu$m to 100 $\mu$m and an inner diameter within a range of from 5 $\mu$m to 50 $\mu$m forming a window in which is exposed the top surface of contact layer 17. Alternating layers of GaP and borosilicate glass (BSG) or of ZnS and CaF$_2$, each $\lambda/4$ n thick, form a top mirror 79 with from two to twenty periods. The mirror contacts the upper surface of contact layer 17 exposed in the window and overlaps a (5 to 50 $\mu$m wide) annular strip of the metal electrode adjacent to the window. The stack of the layers begins with CaF$_2$ or BSG in contact with the contact layer and the electrode. A capping layer of CaF$_2$ or BSG, respectively, completes the stack. Current-voltage (I-V) characteristics, optical power versus injection current characteristics, and the emission linewidths of this embodiment of the RCLED are expected to be comparable to those depicted for the RCLED of the second exemplary embodiment.

FIG. 8 is a schematic representation of a fourth exemplary embodiment of an RCLED according to this invention. In this Figure, elements 11 through 17 are the same as those in the preceding exemplary embodiments. Contact layer 17 is overlaid by a dielectric layer, 81, having a centrally located window, 82. The dielectric layer, such as SiO$_2$, Si$_3$N$_4$, borosilicate glass (e.g. Vycor ®) is from 0.01 to 0.1 $\mu$m thick. A thin metal barrier layer, 83, is deposited on top of dielectric layer 81 and on that portion of contact layer 17 which is exposed in window 82. A layer, 84, of transparent, conductive semiconductor is deposited on top of barrier layer 83. The semiconductor, selected from Cd$_{2-x}$Sn$_x$O$_4$ with x ranging from 0.01 to 0.5 and In$_{2-y}$Sn$_y$O$_3$ with y ranging from 0.1 to 0.2, acts simultaneously as the top electrode and the top mirror of the RCLED. These semiconductor materials, when deposited in a thickness ranging from 50 nm to 500 nm, preferably from 200 to 300 nm, exhibit transmitivity greater than 80 percent and absorption < 10 percent. In a specific example, barrier metal layer 83 is of Ag and is from 5 to 50 nm, preferably from 5 to 20 nm, in thickness. Barrier metal layer 83 establishes a non-alloyed ohmic contact with contact layer and prevents formation of an additional p-n junction between the contact layer and the conductive semiconductor. Current-voltage (I-V) characteristics, optical power versus injection current characteristic and the emission linewidths of this RCLED are expected to be comparable to those depicted for the RCLED of the second exemplary embodiment.

In each of the above embodiments, the active layer may be reduced to a narrow central region from 5 $\mu$m to 50 $\mu$m in diameter. The reduction may be achieved by ion implanting the peripheral section of active layer 15 by ions which are inert with respect to the semiconductor material, such as H$^+$ or O$^+$ in concentration of from $1 \times 10^{18}$ to $5 \times 10^{19}$ per cm$^3$. Alternatively, after semiconductor layers are deposited, the peripheral area of at least layers 15-17 is etched away and a suitable semiconductor is regrown in place of the removed material. Because of this both the spontaneous luminescence and the current are further confined to a narrow centrally located region.

The RCLED is structurally related to vertical cavity surface emitting lasers with semitransparent/semireflective top contacts. However, the two device structures serve different purposes and have different design characteristics. For example, reflectivities of both mirrors equal to or exceeding 99 percent are essential for low threshold operation of the lasers. For the RCLED, only the bottom mirror reflectivity needs to be equal to or exceeding 99 percent, while lower reflectivities, of from 25 to 99 percent, are required of the top mirror, i.e. the requirements for the two mirrors are different for the RCLED. In the RCLED the emission from the active region is a truly spontaneous emission. The use of a resonant cavity improves (narrows) the linewidth and spectral purity of the emission, without promoting the stimulated lasing emission.

Additional advantages and modifications will readily occur to those skilled in the art. Therefore, the invention in its broader aspects is not limited to the specific details, representative devices, and illustrated examples shown and described. Accordingly, various modifications may be made without departing from the spirit or scope of the general inventive concept as defined by the appended claims and their equivalents.

We claim:

1. A light emitting diode (LED) with a resonant Fabry-Perot cavity comprising:
   a semiconductor structure comprising a plurality of layers of semiconductor material and a bottom and a top electrode on opposite surfaces of said structure, wherein said semiconductor material is selected from Group III-V and Group II-VI compound semiconductor materials, said structure comprises in an ascending order:
   a substrate of a first conductivity type,
   a bottom confining layer of the first conductivity type,
   an active layer capable of emitting light spontaneously under forward bias conditions, the thickness of the active layer being within a range of from 1 to 30 nanometers,
   a top confining layer of a second conductivity type, said top and bottom confining layers and the active layer forming an optical cavity of the LED, and a semiconductor contact layer of the second conductivity type, said top electrode is in contact with an upper surface of said contact layer forming an ohmic contact with the contact layer, wherein said LED further comprises:

a bottom mirror and a top mirror placed on opposite sides of said optical cavity and forming a Fabry-Perot resonant cavity, said bottom mirror is located between the bottom confining layer and the substrate and is a high reflectivity mirror ($R_B \geq 99\%$), and said top electrode is a thin metal layer deposited in a thickness permitting passage of light emission through the metal and acting as the top mirror of the resonant cavity, the reflectivity, $R_T$, of said top mirror being $25\% \leq R_T < 99\%$, preferably $40\% \leq R_T \leq 97\%$.

2. The LED of claim 1, in which said bottom mirror is a multilayer distributed Bragg reflector (DBR) mirror comprising a plurality of pairs of semiconductor layers, one layer in each pair having an index of refraction which is higher than the index of refraction of the other layer in the pair, each layer being $\lambda/4$ n thick, wherein $\lambda$ is a spontaneous emission wavelength of the active layer and n is the refractive index of the material of the respective layers.

3. The LED of claim 1, in which said structure is an $Al_xGa_{1-x}As/GaAs$ system with x ranging from 0 to 1.

4. The LED of claim 2, in which said active layer is GaAs, said low refractive index material comprises AlAs and said high refractive material is selected from GaAs, $Al_{0.05}Ga_{0.95}As$ and $Al_{0.14}Ga_{0.86}As$.

5. The LED of claim 1, in which said metal layer consists essentially of a metal selected from the group consisting of silver, aluminum and gold.

6. The LED of claim 5, in which said metal layer is silver from 15 nm to 50 nm thick.

7. A light emitting diode (LED) with a resonant Fabry-Perot cavity comprising:

a semiconductor structure comprising a plurality of layers of semiconductor material and a bottom and a top electrode on opposite surfaces of said structure, wherein said semiconductor material is selected from Group III-V and Group II-VI compound semiconductor materials, said structure comprises in an ascending order:

a substrate of a first conductivity type, a bottom confining layer of a first conductivity type, an active layer capable of emitting light spontaneously under forward bias conditions, a top confining layer of a second conductivity type, said top and bottom confining layers and the active layer forming an optical cavity of the LED, and a semiconductor contact layer of the second conductivity type, said top electrode is in contact with an upper surface of said contact layer forming an ohmic contact with the contact layer, wherein said LED further comprises a bottom mirror and a top mirror placed on opposite sides of said optical cavity and forming a Fabry-Perot resonant cavity, said bottom layer is located between the bottom confining layer and the substrate and is a high reflectivity mirror ($R_B \geq 99\%$), and said top electrode is provided with a centrally located aperture in which is exposed an upper surface of the contact layer, the interface between said upper surface and air overlying said upper surface forming said top mirror having reflectivity $25\% \leq R_T \leq 99\%$, preferably $25\% \leq R_T \leq 35\%$.

8. The LED of claim 7, in which said top electrode is a metal alloy selected from Au-Zn and Au-Be and deposited on the contact layer in a thickness ranging from 50 nm to 300 nm.

9. The LED of claim 7, in which said bottom mirror is a multilayer distributed Bragg reflector (DBR) mirror comprising a plurality of pairs of simiconductor layers, one layer in each pair having an index of refraction which is higher than the index of refraction of the other layer in the pair, each layer being $\lambda/4$ n thick, wherein $\lambda$ is a spontaneous emission wavelength of the active layer and n is the refractive index of the material of the respective layers.

10. the LED of claim 7, in which said structure is an $Al_xGa_{1-x}As/GaAs$ system with x ranging from 0 to 1.

11. The LED of claim 9, in which said active layer is GaAs, said low refractive index material comprises AlAs and said high refractive material is selected from GaAs, $Al_{0.05}Ga_{0.95}As$ and $Al_{0.14}Ga_{0.86}As$.

12. A light emitting diode (LED) with a resonant Fabry-Perot cavity comprising:

a semiconductor structure comprising a plurality of layers of semiconductor material and a bottom and a top electrode on opposite surfaces of said structure, wherein said semiconductor material is selected from Group III-V and Group II-VI compound semiconductor materials, said structure comprises in an ascending order:

a substrate of a first conductivity type, a bottom confining layer of a first conductivity type, an active layer capable of emitting light spontaneously under forward bias conditions, a top confining layer of a second conductivity type, said top and bottom confining layers and the active layer forming an optical cavity of the LED, and a semiconductor contact layer of the second conductivity type, said top electrode is in contact with an upper surface of said contact layer forming an ohmic contact with the contact layer, wherein said LED further comprises a bottom mirror and a top mirror placed on opposite sides of said optical cavity and forming a Fabry-Perot resonant cavity, said bottom layer is located between the bottom confining layer and the substrate and is a high reflectivity mirror ($R_B \geq 99\%$), and said top electrode comprises a thin metal layer overlying the contact layer and an optically transparent conductive semiconductor material overlying said metal layer, the conductive semiconductor material is selected from the group consisting of cadmium tin oxide and indium tin oxide, and said metal layer and said conductive semiconductor layer acting simultaneously as the top electrode and the top mirror of said LED, the reflectivity, $R_T$, of the top mirror being $25\% \leq R_T \leq 99\%$.

13. The LED of claim 12, in which said metal layer is of silver deposited in a thickness of from 15 nm to 50 nm, and said transparent conductive semiconductor material is deposited in a thickness of from 50 to 500 nm.

14. The LED of claim 12, in which said bottom mirror is a multilayer distributed Bragg reflector (DBR) mirror comprising a plurality of pairs of semiconductor layers, one layer in each pair having an index of refraction which is higher than the index of refraction of the other layer in the pair, each layer being $\lambda/4n$ thick, wherein λ is a spontaneous emission wavelength of the active layer and n is the refractive index of the material of the respective layers.

15. The LED of claim 12, in which said structure is an $Al_xGa_{1-x}As/GaAs$ system with x ranging from 0 to 1.

16. The LED of claim 14, in which said active layer is GaAs, said low refractive index material comprises AlAs and said high refractive material is selected from GaAs, $Al_{0.05}Ga_{0.95}As$ and $Al_{0.14}Ga_{0.86}As$.

17. A light emitting diode (LED) comprising:
a semiconductor structure comprising a plurality of layers of semiconductor material and a bottom and a top electrode on opposite surfaces of said structure, wherein said semiconductor material is selected from Group III-V and Group II-VI compound semiconductor materials, said structure comprises in an ascending order:
a substrate of a first conductivity type,
a bottom confining layer of the first conductivity type,
an active layer capable of emitting light spontaneously under forward bias conditions,
a top confining layer of a second conductivity type, said top and bottom confining layers and the active layer forming an optical cavity of the LED, and
a semiconductor contact layer of the second conductivity type,
said top electrode is in contact with an upper surface of said contact layer forming an ohmic contact with the contact layer,
wherein said LED further comprises:
a bottom mirror and a top mirror on opposite sides of said optical cavity and forming a Fabry-Perot resonant cavity, said bottom mirror is located between the bottom confining layer and the substrate and is a high reflectivity mirror ($R_B \geq 99\%$), and
said top electrode comprises an annular thin metal layer overlying the contact layer, and said top mirror comprises a stack of a plurality of pairs of high index of refraction and low index of refraction layers, said stack overlying that surface of the contact layer which is exposed in the central aperture of the annular metal layer and partially overlapping an edge of the annular metal layer adjacent said aperture, the reflectivity, $R_T$, of the top mirror being $25\% \leq R_T \leq 99\%$, preferably $80\% \leq R_T \leq 99\%$.

18. The LED of claim 17, in which said annular metal layer is Ag ranging from 50 to 300 nm in thickness, with an outer diameter ranging from 10 μm to 100 μm and an inner diameter ranging from 5 μm to 50 μm.

19. The LED of claim 18, in which said stack included from 2 to 20 pairs of high/low index material selected from GaP/borosilicate and $ZnS/CaF_2$, each layer in the stack being λ/4n thick, said stack overlapping a 5 to 50 μm wide strip of said top electrode.

20. The LED of claim 17, in which said bottom mirror is a multilayer distributed Bragg reflector (DBR) mirror comprising a plurality of pairs of semiconductor layers, one layer in each pair having an index of refraction which is higher than the index of refraction of the other layer in the pair, each layer being λ/4n thick, wherein λ is a spontaneous emission wavelength of the active layer and n is the refractive index of the material of the respective layers.

21. The LED of claim 17, in which said structure is an $Al_xGa_{1-x}As/GaAs$ system with x ranging from 0 to 1.

22. The LED of claim 20, in which said active layer is GaAs, said low refractive index material comprises AlAs and said high refractive material is selected from GaAs, $Al_{0.05}Ga_{0.95}As$ and $Al_{0.14}Ga_{0.86}As$.

* * * * *